(12) United States Patent
Lee

(10) Patent No.: US 6,387,799 B1
(45) Date of Patent: May 14, 2002

(54) METHOD FOR FABRICATING TITANIUM SILICIDE FILM

(75) Inventor: Yoon-Jik Lee, Choongcheongbuk-Do (KR)

(73) Assignee: Hyundai Electronics Industries Co., Ltd., Kyoungki Do (KR)

( * ) Notice: Subject to any disclaimer, the term of this patent is extended or adjusted under 35 U.S.C. 154(b) by 0 days.

(21) Appl. No.: 09/767,261

(22) Filed: Jan. 23, 2001

(30) Foreign Application Priority Data

Aug. 16, 2000 (KR) .............................. 00-47187

(51) Int. Cl.$^7$ ......................................... H01L 21/4763
(52) U.S. Cl. ..................... 438/649; 438/775; 438/682
(58) Field of Search ................. 438/775–777, 438/762–798, 645–695

(56) References Cited

U.S. PATENT DOCUMENTS 6,040,021 A * 3/2000 Miyamoto .................. 427/576
6,175,155 B1 * 1/2001 Hill .............................. 257/754
6,221,792 B1 * 4/2001 Yang et al. .................. 438/776

FOREIGN PATENT DOCUMENTS

JP 08186173 A * 7/1996

* cited by examiner

*Primary Examiner*—Jey Tsai
(74) *Attorney, Agent, or Firm*—Morgan, Lewis & Bockius LLP

(57) ABSTRACT

A method for fabricating a titanium silicide film in which when a titanium silicide film is fabricated by using a Chemical Vapor Deposition, an $NH_3$-gas plasma process or an $N_2$-gas plasma process is conducted for several times to minimize etching of the silicon substrate and consumption of a dopant of an impurity layer, thereby restraining a leakage current from increasing. The method for fabricating a titanium silicide film includes the steps of: (a) depositing a titanium silicide film as thick as 1/n of a total desired thickness on a silicon substrate by using the Chemical Vapor Deposition method; (b) processing the titanium silicide film with a nitrogen-gas plasma or ammonia-gas plasma; and (c) repeatedly performing step (a) and step (b) n times.

5 Claims, 3 Drawing Sheets

METHOD FOR FABRICATING TITANIUM SILICIDE FILM

BACKGROUND OF THE INVENTION

1. Field of the Invention

The present invention relates to a method for fabricating a semiconductor device, and more particularly to a method for fabricating a silicide film on the upper surface of a silicon substrate.

2. Description of the Background Art

In order to lower the contact resistance when fabricating a semiconductor device, generally a silicide film, a low resistant material is formed at the contact portion between conductive layers. Especially, a titanium silicide film which has a relatively low resistance compared to that of other silicide, is drawing much attention as a wiring material.

A conventional method for fabricating a titanium silicide film typically employs a self-alignment method. In such a method, a titanium film is deposited on a silicon film by a physical vapor deposition (PVD) and subject to a thermal treatment causing a silicide reaction between titanium and silicon, thereby forming a titanium silicide film.

The conventional method for fabricating a titanium silicide film by the self-alignment method will now be described with reference to the accompanying drawings.

FIGS. 1A and 1B illustrate a fabricating process of a silicide film in accordance with a conventional art.

As shown in FIG. 1A, a titanium film 11 is formed on the upper surface of the silicon layer 10.

Next, the titanium film 11 is subject to thermal treatment at the temperature of about 650° C. Then, as shown in FIG. 1B, the silicon layer 10 and the titanium film 11 are reacted to form a titanium silicide layer 12.

However, during the thermal treatment for forming the titanium silicide film by the self-alignment method, an impurity, such as oxygen, permeates into the titanium film, causing agglomeration of silicide.

In order to solve such a problem, a process has been developed and commercially used in which a titanium nitride (TiN) is deposited on the titanium film and thermally treated.

However, in such conventional method in the event that the titanium silicide layer is formed in a contact hole having a high aspect ratio, the titanium film step coverage characteristic is degraded when formed by the physical vapor deposition method.

Especially, since the titanium film is not deposited on the bottom of the contact hole and thickly deposited at the entrance of the contact hole, the entrance of the contact hole is clogged.

In addition, the method for fabricating the titanium silicide film by the self-alignment method limits the thickness of the film to be formed and the titanium silicide film fabricated by the self-alignment method has a low thermal stability.

In order to solve such problems, a method for forming a titanium silicide film by using a Plasma Enhanced Chemical Vapor Deposition has been recently proposed.

That is, a titanium silicide film is deposited by reduction between $TiCl_4$ and silane gas. A reaction formula for forming titanium silicide is as follows.

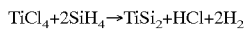

$$TiCl_4 + 2SiH_4 \rightarrow TiSi_2 + HCl + 2H_2$$

Though the Plasma Enhanced Chemical Vapor Deposition has a favorable bottom coverage characteristic, it also has the following shortcomings.

When a titanium silicide film is formed on the upper surface of a silicon substrate by using Chemical Vapor Deposition, the silicon substrate is etched due to HCl, a by-product of the reaction of TiCl4 and silane gas, a source gas. This results in an uneven interface between the silicon substrate and the deposited titanium silicide film.

In addition, its junction depth is reduced, causing increase in a leakage current.

Moreover, as the doping concentration at the interface of the semiconductor substrate (silicon) and the titanium-silicide film is reduced, contact resistance is increased.

Furthermore, since the process of depositing the titanium silicide film by using the plasma enhanced chemical vapor deposition method is conducted at a high temperature, the silicide reaction occurs rapidly, so that when the titanium silicide is deposited, the agglomeration phenomenon also occurs thereon, resulting in a rough interface between the silicide and the silicon substrate.

SUMMARY OF THE INVENTION

Therefore, the present invention provides a method for fabricating a titanium silicide film so that when the film is fabricated by using a Chemical Vapor Deposition, an $NH_3$-gas or an $N_2$-gas plasma process is performed several times, thereby minimizing etching of the silicon substrate and consuming of a dopant of an impurity layer, restraining an increase in leakage current.

To achieve these and other advantages and in accordance with the purpose of the present invention, as embodied and broadly described herein, there is provided a method for fabricating a titanium silicide film including the steps of: a) depositing a titanium silicide film as thick as $\frac{1}{n}$ of a total desired thickness on a silicon substrate by using the Chemical Vapor Deposition method; b) processing the titanium silicide film with a nitrogen-gas plasma or an ammonia-gas plasma; and c) repeatedly performing process a) and b) for 'n' times.

In the above method, the step of processing the titanium silicide film with a nitrogen-gas plasma or an ammonia-gas plasma refers to a process of forming a nitride film of less than 100 Å in thickness on the upper surface of the titanium silicide film.

In the above method, step a) and step b) are performed in the same apparatus.

In the above method, before performing step a) the following steps are sequentially performed, forming an impurity layer by ion-implanting the silicon substrate, forming an insulation film on the silicon substrate, and partially etching the insulation film to expose the upper surface of the impurity layer, thereby forming a contact hole.

The foregoing and other features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A method for fabricating a titanium silicide film will now be described with reference to FIGS. 2A through 2D.

Figure 1A:
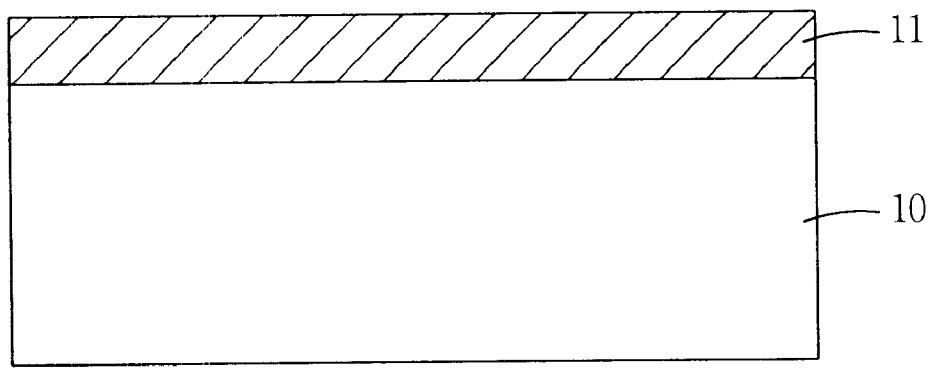
FIGS. 1A and 1B illustrate a process of fabricating a silicide film in accordance with a conventional art.
Figure 1B:
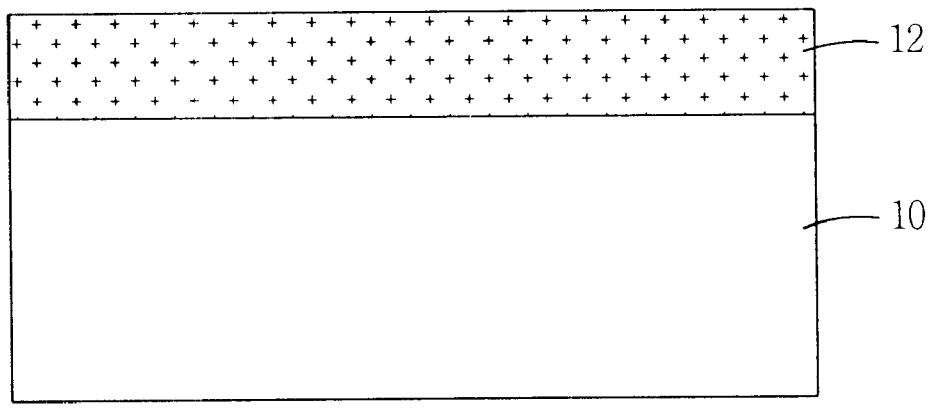
Figure 2A:
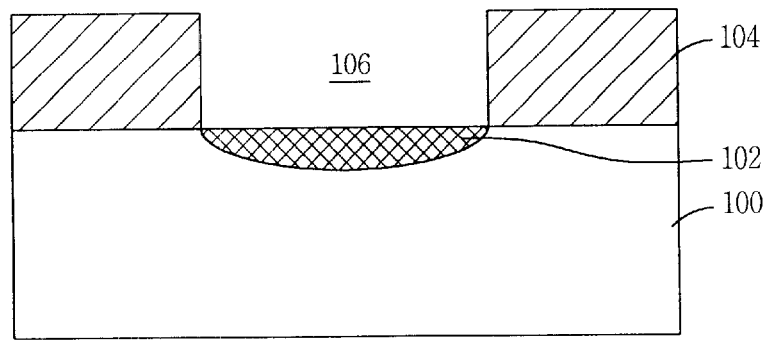
FIGS. 2A through 2F illustrate a sequential process of fabricating silicide film in accordance with the present invention.

As shown in FIG. 2A, an impurity is ion-implanted on the upper surface of a silicon substrate 100 to form a conductive layer (an impurity layer) 102. Next, after an insulation layer 104 is formed on the silicon substrate 100, the insulation layer 104 is selectively etched to expose the upper surface of the conductive layer 102, forming a contact hole 106.

Then, in order to remove a natural oxide film and other contaminant from the surface of the conductive layer 102, the inside of the contact hole is washed.

Figure 2B:
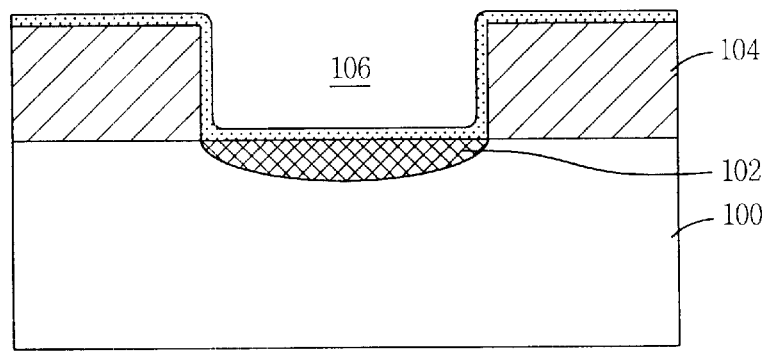

Thereafter, as shown in FIG. 2B, a first titanium silicide film 108 is formed on the inner wall surface and the bottom surface of the contact hole 106 by Plasma Enhanced Chemical Vapor Deposition (PECVD).

At this time, the first titanium silicide film 108 has a thickness of about one-tenth of the titanium silicide film that is to be finally formed on the contact hole.

Thereafter, in order to remove the natural oxide film and other contaminant on the upper surface of the conductive layer 102, the inside of the contact hole 106 is washed.

Figure 2C:
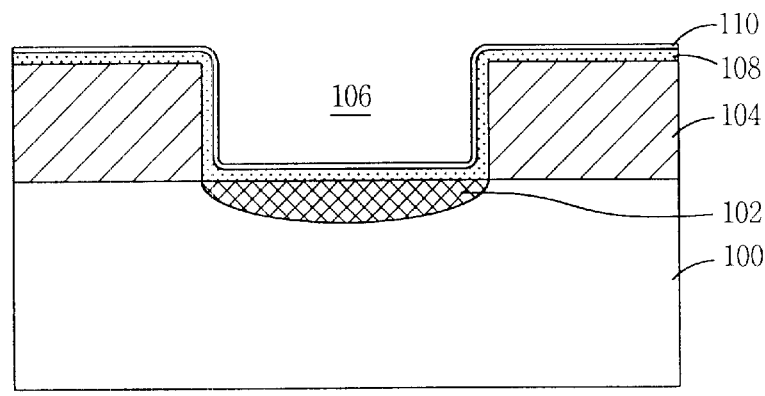

The resulting structure in FIG. 2B is processed with $NH_3$-gas plasma or mixed $N_2/H_2$-gas plasma, so that, as shown in FIG. 2C, a first nitride film 110 is formed on the surface of the first titanium silicide film 108.

The first nitride film 110 has a thickness of less than 100 Å and refers to a TiN film obtained as nitrogen contained in the $NH_3$-gas plasma or in the $N_2/H_2$-gas plasma is reacted on the titanium contained in the silicide film.

Alternatively, in order to form the first nitride film 110, a gas containing nitrogen may be thermally treated in an $NH_3$ atmosphere or in a mixture of $N_2/H_2$ atmosphere, rather than the plasma-processing it.

Figure 2D:
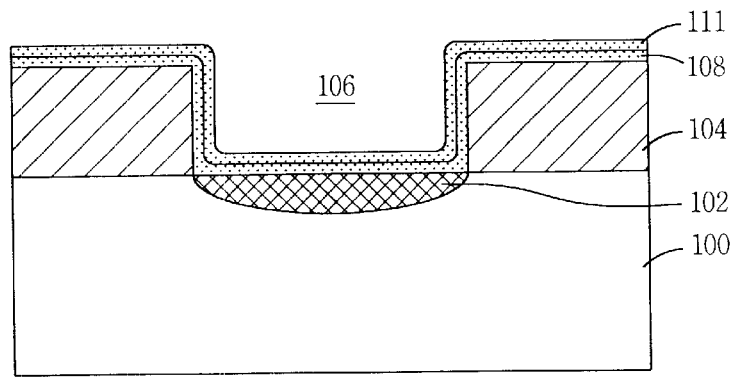

Next, as shown in FIG. 2D, a second titanium silicide film 112 is formed on the upper surface of the resulting structure of FIG. 2C by using the Plasma Enhanced Chemical Vapor Deposition.

The second titanium silicide film 112 has the same thickness of that of the first titanium silicide film 108. And, as the titanium of the first nitride TiN is reacted on silicon during the process of depositing the second titanium silicide film 112, it turns to a titanium silicide film, and as nitrogen is discharged outwardly, the first nitride film 110 is removed.

Resultantly, it has the same structure as the structure in which the second titanium silicide film 112 is directly deposited on the upper surface of the first titanium silicide film 108.

Figure 2E:
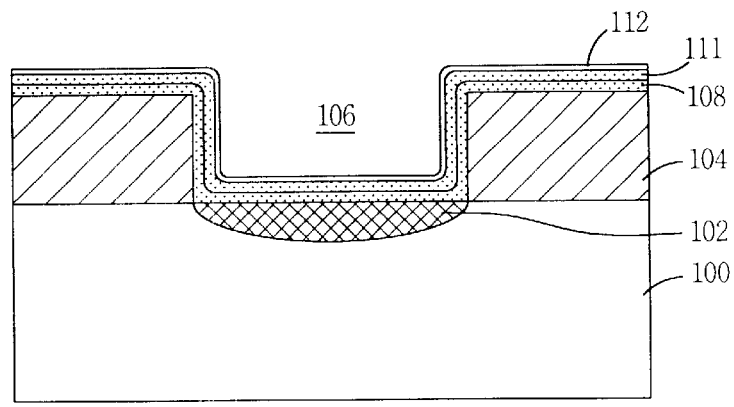

Next, as shown in FIG. 2E, a second nitride film 114 is formed on the upper surface of the second titanium silicide film 112 in the same manner as that of FIG. 2B.

Figure 2F:
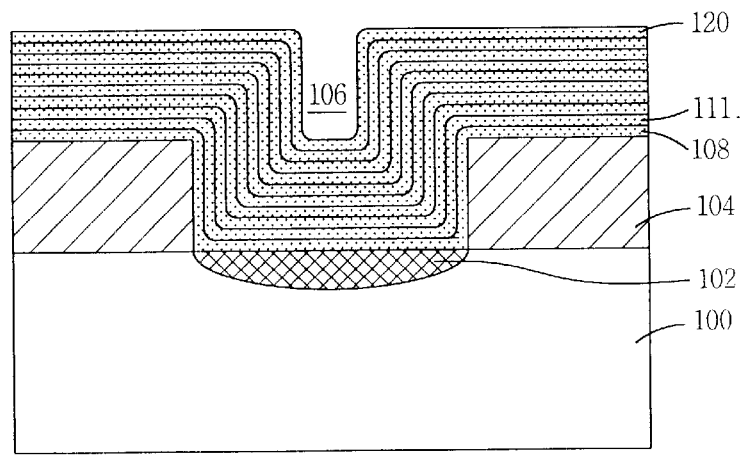

Thereafter, the process of forming the titanium silicide film by using the Chemical Vapor Deposition, and the process of forming the nitride film having a thickness of less than 100 Å on the upper surface of the titanium silicide film, are repeatedly conducted ten times. Thereby forming a tenth titanium silicide film 120, completing the process of fabricating the titanium silicide film. Such process is depicted in FIGS. 2E and 2F.

In the embodiment of the present invention, a silicide film having a one-tenth thickness of the finally formed silicide film is formed initially, and the process is repeatedly conducted 10 times, finally obtaining a silicide film having a desired thickness. And, after each silicide film is deposited, a process of forming a nitride film is conducted every time.

Although in the present invention, the silicide film having a desired thickness was divided into 10 times for deposition, it may be freely divided into 3~15 times as desired for deposition.

Meanwhile, in the present invention, the titanium silicide film is formed by using the Chemical Vapor Deposition in which TiCl gas and silane gas are used as source gases. The titanium silicide film may also be formed by using the Chemical Vapor Deposition in which $TiCl_4$ gas and hydrogen gas are used as source gases.

In addition, the process of forming the nitride film is preferably conducted in the same Chemical Vapor Deposition apparatus used for forming the titanium silicide film.

As so far described in the method of the present invention for fabricating a titanium silicide film, the process of forming a thin nitride film is conducted during the process of depositing the titanium silicide film. Therefore, the nitride film prevents etching of the silicon substrate due to the chlorine (Cl) contained in $TiCl_4$, the source gas for depositing titanium silicide. The nitride film also prevents an increase in the leakage current.

In addition, since the impurity layer formed on the silicon substrate is restrained from etching, its junction depth is prevented from being reduced. Therefore, increase in the contact resistance between the conductive wiring and the impurity layer can be restrained.

Moreover, since the nitride film is formed between the thin titanium silicide films, silicide reaction at high temperature that would lead to agglomeration of the titanium silicide film is prevented, allowing the titanium silicide film to be evenly formed.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for fabricating a titanium silicide film comprising the steps of:
   (a) forming a conductive layer on a semiconductor;
   (b) forming an insulating layer on the conductive layer;
   (c) selectively etching the insulating layer exposing a portion of the conductive layer, forming a contact hole;
   (d) forming a first titanium silicide film on the insulating layer, and on an inner wall surface and on a bottom surface of the contact hole using a Chemical Vapor Deposition method, wherein the first titanium silicide film is as thick as 1/n of a total desired thickness;

(e) processing the first titanium silicide film with nitrogen-gas plasma or ammonia-gas plasma, forming a nitride film on the surface of the first titanium silicide film; and (f) repeatedly performing step (d) and (e) for n times, wherein n is at least one and wherein each nitride film is removed when a respective titanium silicide film is deposited on the nitride film.

2. The method according to claim 1, wherein the titanium silicide film is processed with $NH_3$-gas plasma or mixture gas of $N_2/H_2$ plasma.

3. The method according to claim 1, wherein the titanium silicide film is thermally treated in a $NH_3$ atmosphere or in a mixture gas of $N_2/H_2$ atmosphere.

4. The method according to claim 1, wherein step (d) and step (e) are performed in the same apparatus.

5. The method according to claim 1, wherein the processing of the titanium silicide film with nitrogen gas plasma or ammonia gas plasma forms a nitride film having a thickness of less than 100 Å.

* * * * *